(12) United States Patent
Coutelou et al.

(10) Patent No.: US 11,071,071 B2
(45) Date of Patent: Jul. 20, 2021

(54) METHOD FOR OPTIMIZING POWER SUPPLY LIFE OF AN INDUSTRIAL SENSOR PLATFORM

(71) Applicant: Schneider Electric Industries SAS, Rueil Malmaison (FR)

(72) Inventors: Olivier Coutelou, Grenoble (FR); Thierry Chiche, Saint Ismier (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 87 days.

(21) Appl. No.: 16/504,952

(22) Filed: Jul. 8, 2019

(65) Prior Publication Data

US 2020/0037271 A1    Jan. 30, 2020

(30) Foreign Application Priority Data

Jul. 30, 2018   (EP) .................................. 18186267

(51) Int. Cl.
| | |
|---|---|
| *H04W 72/04* | (2009.01) |
| *H04W 52/42* | (2009.01) |
| *G01R 31/371* | (2019.01) |
| *H02J 7/00* | (2006.01) |
| *H04W 52/02* | (2009.01) |
| *H01M 10/44* | (2006.01) |
| *H01M 10/42* | (2006.01) |

(52) U.S. Cl.
CPC .......... *H04W 52/42* (2013.01); *G01R 31/371* (2019.01); *H01M 10/446* (2013.01); *H02J 7/0047* (2013.01); *H04W 52/0232* (2013.01); *H01M 2010/4278* (2013.01); *H02J 7/0048* (2020.01)

(58) Field of Classification Search
CPC ............. H04W 52/42; H04W 52/0232; H04Q 2209/86; H04Q 2209/88; H04Q 9/00; H01M 10/446; H01M 2010/4278
See application file for complete search history.

(56) References Cited

U.S. PATENT DOCUMENTS

| | | | |
|---|---|---|---|
| 2010/0097889 A1* | 4/2010 | Golparian | ................ G01V 1/22 367/77 |
| 2015/0302723 A1 | 10/2015 | Reade et al. | |
| 2017/0230074 A1* | 8/2017 | Rose | .................... H04B 1/1036 |

OTHER PUBLICATIONS

Hill, Jason L., et al., "MICA: A Wireless Platform for Deeply Embedded Networks", IEEE MICRO, Nov.-Dec. 2002, pp. 12-24.

(Continued)

*Primary Examiner* — Lan-Huong Truong
(74) *Attorney, Agent, or Firm* — Locke Lord LLP

(57) ABSTRACT

A method for optimizing power supply life time of an industrial sensor platform which includes a processing unit, a power supply, and transmission means. The method identifies a sensor connected to an industrial platform, verifies a functional setting of the platform, determines sensor power consumption and sensor measurement time ts, and determines transmission power consumption of the transmission means. The method further includes acquiring input parameter settings which includes expected battery life time, sensor reading interval Ts and periodic transmission interval Tw. Which is followed by calculating an optimum for power supply life time, sensor reading interval Ts, and periodic transmission interval Tw. And adjusting settings of the platform for sensor reading interval Ts and periodic transmission interval Tw according to the optimum calculated.

11 Claims, 8 Drawing Sheets

(56) References Cited

OTHER PUBLICATIONS

Kansal, Aman, et al., "Power Management in Energy Harvesting Sensor Networks", ACM Transactions on Embedded Computing Systems, vol. 6, No. 4, Article 32, pp. 1-38, Sep. 2007.
Extended European Search Report for European Patent Application No. 18186267.3, dated Dec. 19, 2018, 8 pages.

* cited by examiner

| Function Type | Reporting | Reporting | Reporting | Counter | Counter | Counter | Alarming | Alarming | Alarming | Alarming |
|---|---|---|---|---|---|---|---|---|---|---|
| Function nr. | F0 | F1 | F2 | F3 | F4 | F5 | F6 | F7 | F8 | F9 |
| Sensor output | analog output mA /V + time stamp | digital output | analog output mA /V | dry contact counter | digital output counter | analog value | dry contact closing | analog value threshold crossing | pulse frequency analysis | digital output change |
| Application example | pH monitoring | trash container level monitoring | tank fluid level monitoring | fluid meter measurement | occurence measurement | strain gauge supervision | excess pressure | filter fouling | motor speed monitoring | tank fluid level monitoring |
| Sensor output sampling | 15 minutes | n.a. | n.a. | n.a. | 60s | 5 minutes | n.a. | 30 minutes | 5 minutes | 30 minutes |
| Message interval | 2 hours | 24 hours | 1 hour | 24 hours | 24 hours | 24 hours | 24 hours | 24 hours | 24 hours | 24 hours |
| Relation Ts,Tw | $Ts \leq Tw$ | $Ts = Tw$ | $Ts = Tw$ | no Ts | $Ts \leq Tw$ | $Ts \leq Tw$ | no Ts | $Ts \leq Tw$ | $Ts \leq Tw$ | $Ts \leq Tw$ |

FIG. 5

METHOD FOR OPTIMIZING POWER SUPPLY LIFE OF AN INDUSTRIAL SENSOR PLATFORM

The present invention relates to an industrial sensor platform/system and a method for optimizing battery life of such a platform/system.

BACKGROUND

Industrial sensors are commonly used in stand-alone installations such as e.g. a car wash equipped with a sensor for counting the number of vehicles. An underground garbage storage system equipped with a level sensor for indicating whether a container needs to be emptied. Or a quality control installation equipped with a PH sensor for monitoring a water resource. These installations may also be remote, isolated and distant from any power infrastructure and lack access to any wired cable communication network.

The above mentioned industrial sensors collect measurements and the installation periodically communicates the measured values, for example for a limited number of times a day, such as every two hours. Systems have been provided that add wireless network communication functionality to a remote sensor, but these often come without power supply. Also systems are available having sensors for specific parameter measurements which are equipped with dedicated power supplies, such as batteries. These sensors and power supplies are specifically developed for the particular use, requiring re-development for new or alternative use applications.

For some of these prior art sensors, there are (web based) tools for calculating an estimate of the battery life time. However, these are based on static inputs. The inputs are not updated over time to take in account actual use and/or performance of the installation. Hence, an estimation of the battery life time may proof not to be very accurate and reliable.

SUMMARY OF INVENTION

It is an object of the invention to alleviate the disadvantages of isolated installations regarding power supply and communication, and in particular the reliability of estimates of battery life time.

This object is achieved by providing a method for optimizing power supply life time of an industrial sensor platform which includes a processing unit, a power supply, and transmission means. The method includes identifying a sensor connected to an industrial platform for measuring sensor measurement values, verifying a functional setting of the platform, determining sensor power consumption and sensor measurement time ts of the identified industrial sensor, and determining transmission power consumption of transmission means. The method further includes acquiring input parameter settings comprising an expected battery life time, a sensor reading interval Ts and periodic transmission interval Tw. Which is followed by calculating an optimum for power supply life time, sensor reading interval Ts, and periodic transmission interval Tw, based on the sensor power consumption, the transmission power consumption, the power supply voltage, and the functional setting of the system. And adjusting settings of the platform for sensor reading interval Ts and periodic transmission interval Tw according to the optimum calculated.

There is further provided a sensor platform capable of performing the disclosed method.

Taking in account various variables as input parameters and considering intended functionality and desired duration of stand-alone operation allows to determine an optimization of trade-offs for these parameters.

The following may be considered as input parameters are: power consumption of the sensor, sensor measurement duration ts, sensor reading interval Ts, transmission time duration for sending ttx and for receiving trx, and periodic transmission interval Tw. Further considered are a functional setting Fi of the industrial application of the sensor and the LPWAN modulation of the transmission means.

The input parameters allow to calculate an expected battery life time which may be compared with a desired battery life time. By adjusting periodic transmission interval Tw and sensor reading interval Ts, the battery life time of the industrial platform may be optimised.

Real time updates of the input parameters, such as LPWAN modulation, allows updating of periodic transmission interval Tw and sensor reading interval Ts over time. Which in turn influence the expected battery life time.

Particularly advantageous elaborations of the invention are laid down in the dependent claims. Further objects, aspects, effects and details are described in the following detailed description of a number of exemplary embodiments, with reference to the drawings.

BRIEF DESCRIPTION OF DRAWINGS

By way of example only, the embodiments of the present disclosure will be described with reference to the accompanying drawings, wherein:

FIG. 5 is a table showing various possible functional settings for a sensor;

DETAILED DESCRIPTION

Figure 1:
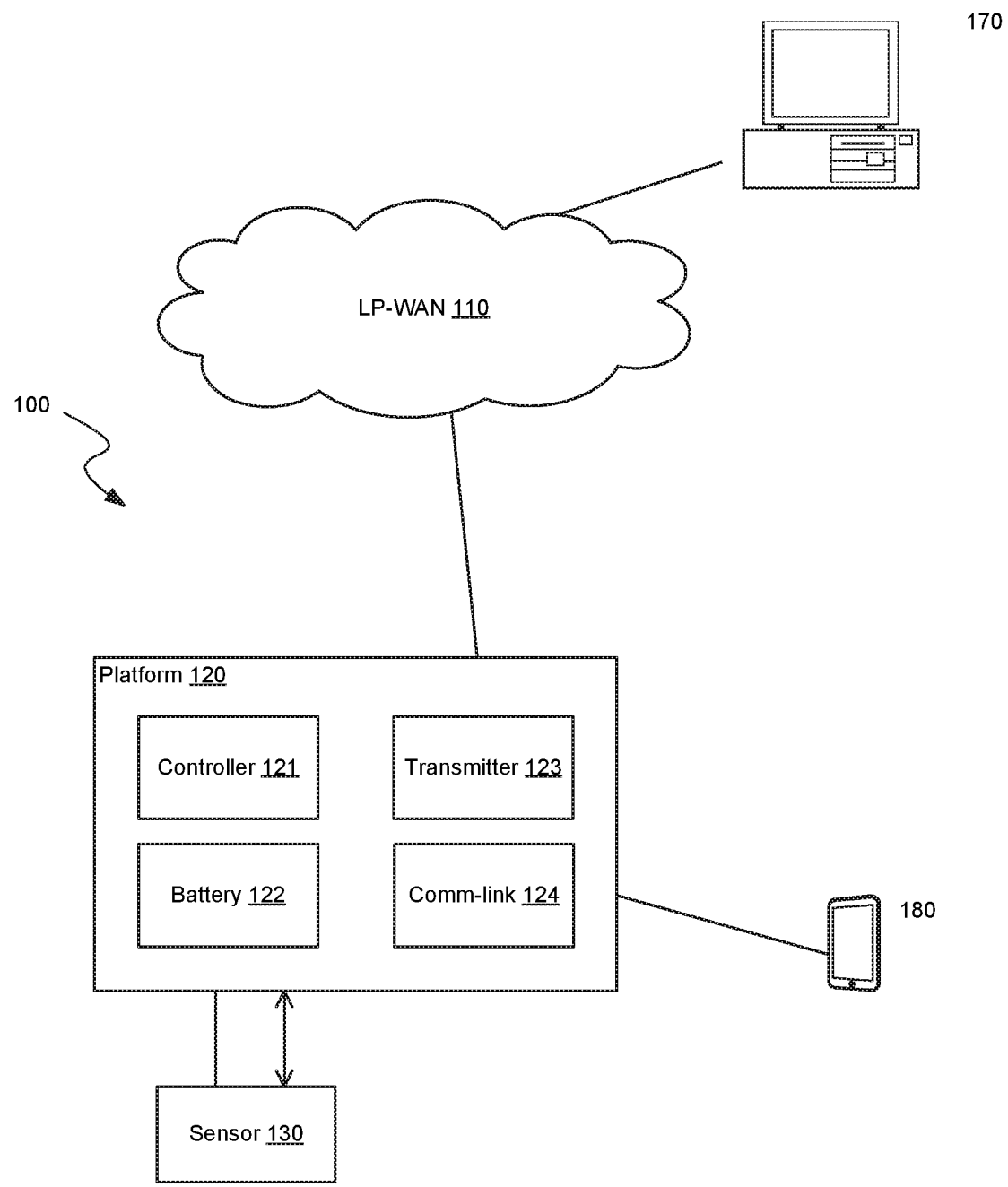
FIG. 1 illustrates schematically an example of an industrial sensor system in accordance with the invention.

Referring to FIG. 1, an industrial sensor system 100 is shown. The industrial sensor system 100 includes a sensor platform 120 which is electrically connected to a sensor 130 for providing power and communicatively connected to the sensor 130 for receiving data. The platform 120 provides connection via a Low Power-Wide Area Network LP-WAN 110 to an end user application on a terminal or computer 170. The platform 120 may further provide a local communication link 124 to a user mobile device 180, such as a mobile phone or tablet, via a local wireless connection, such as Near Field Communication NFC or Bluetooth Low Energy BLE or via a local wired connection such as a USB cable.

The platform 120 includes a processing unit 121, in this example a controller, a power supply 122, in this example a battery, and transmission means 123, in this example a LoRa transmitter. The power supply 122 provides power for both the platform 120 and the sensor 130. The power supply 122 is arranged for switching power to the sensor 130 on/off with a periodic interval Ts and for a duration period ts, as set by the processing unit 121. The periodic interval Ts is referred to as sensor reading interval. The duration period ts is referred to as sensor measurement time and determined by the time required by the sensor to perform at least one measurement. The transmission means 123 are arranged for transmitting sensor measurement values with a periodic transmission interval Tw. Transmission is characterized by a transmission time duration that depends on the size of the message and whether sending or receiving. These different transmission time durations are referred to as ttx for sending and trx for receiving.

The industrial sensor 130 may be any type of sensor, such as a pressure sensor, fluid level detector, electrical current/voltage meter, pH-meter, leakage/strain detector, incident or occurrence counter, or velocity/acceleration meter. Thus, any sensor capable of measuring a particular sensor value may be connected to the platform 120. The sensor value may be transmitted as an electrical signal, the value for example being represented by an analog current value of 4-20 mA output, an analog voltage of 0-10 V or a digital value zero "0" or one "1".

For each different type of sensor, the time the sensor requires to perform a reliable measurement may be different. This may be expressed as a minimum amount of time necessary and is referred to as the sensor measurement duration ts. Depending on the type of application, the time required between consecutive measurements may be different; this may be set as a minimum and/or maximum and is referred to as sensor reading interval Ts.

In the case of e.g. counting the number trucks having unloaded, the required sample frequency is quite low: a truck may take for example 10-15 minutes to unload with a minimum interval of at least 15 minutes between consecutive trucks unloading. Accordingly, a counter being switched on and off for every 5 minutes will be able to count all trucks unloading. In some other cases sensor measurement time ts and sensor reading interval Ts may even be undefined or non-existent, such as for a pressure switch or a dry contact counter, which merely report a status of whether a threshold is crossed or not.

The power consumption of sensors and the required voltage of the power supply depends upon the type of sensor used. Sensor manufacturers provide these and other sensor characteristics, such as the sensor measurement time ts, in reference manuals and are thus publicly available.

The transmission means 123 of the platform 120 also requires power, which depends on the type of Low Power Wide Area Network 110, such as e.g. LoRa or SigFox. In case of LoRa, which applies an adaptive data rate scheme, the modulation of the transmission signal may be adapted. These variations are standardized and referred to as SFn, with n ranging from 7-12, for each of which the power consumption is known. Hence, a change in modulation is also reflected in the transmission power consumption. Along with these adaptations of the modulation, the transmission time duration also varies. Again, as modulation also determines the size of messages and the time required for transmission. The time required for transmission may further differ for whether sending or receiving. These different time durations are referred to as ttx for sending and trx for receiving.

The power supply and voltage of the battery 122 may be adapted to the power and voltage required by the sensor 130 and to the requirements of the platform 120 itself. Or the platform 120 may be capable of setting the supply voltage for the sensor, for example 8 VDC or 24 VDC.

Figure 2:
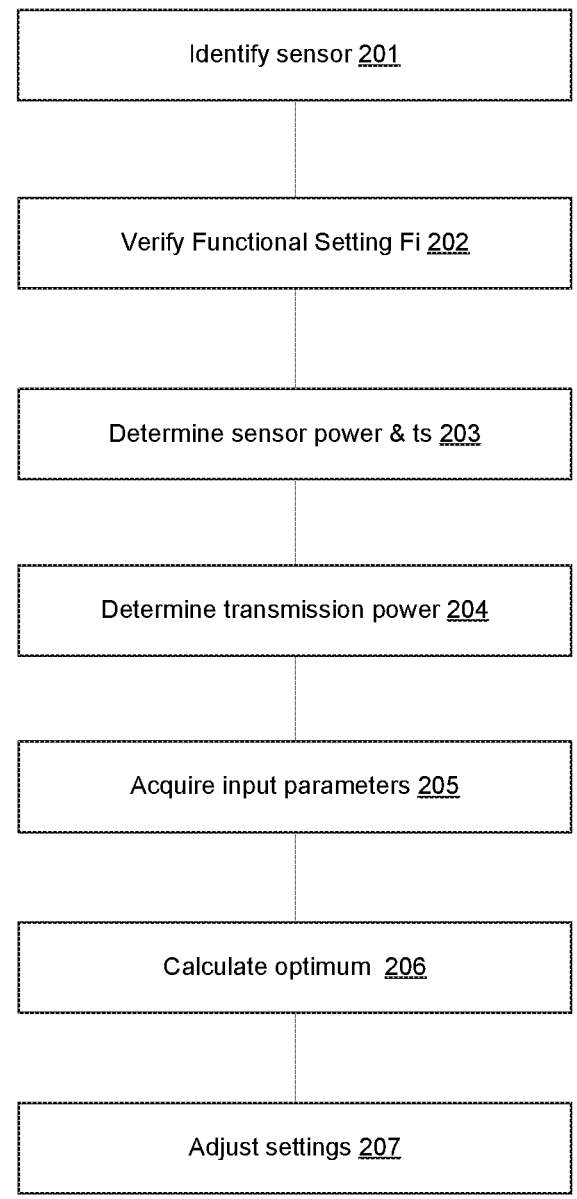
FIG. 2 illustrates an example of a method for optimizing power supply life time of a system of FIG. 1 in accordance with the invention.

Turning to FIG. 2, an example of a method is shown for optimizing power supply i.e. battery life of an industrial sensor platform such as described in relation to FIG. 1. The method may be implemented on the terminal 170, the mobile device 180 and/or the controller 121 of the platform 120 itself.

The method includes identifying 201 an industrial sensor measuring sensor values, verifying a functional setting Fi of the sensor platform 202, determining sensor power consumption and sensor measurement duration ts 203 of the identified industrial sensor, and determining transmission power consumption 204 of the transmission means. The above parameters may be obtained by looking up in a database stored on the platform, on the mobile device, or on a remotely accessible pc or cloud infrastructure.

The method further includes acquiring input parameter settings 205 that include an expected battery life time, a sensor reading interval Ts and periodic transmission interval Tw;

With these parameters and industrial settings and determined, the method follows by calculating an optimum 206 for power supply life time, sensor reading interval Ts, and transmission time interval Tw. And the method concludes by adjusting settings 207 of the industrial platform according to the optimum calculated.

Identifying 201 the industrial sensor 130 capable of measuring sensor values may be performed by obtaining a reference or identifier of the sensor from an end user. Or it may be retrieved from the sensor itself during communication or sensor read out.

Once the industrial sensor is identified, power consumption of the sensor may be determined 202 together with a sensor measurement duration ts. The sensor power consumption depends on the sensor measurement duration ts, a sensor voltage, and sensor current consumption. These may be obtained from a pre-installed/prior downloaded database containing sensor characteristics for various sensor references.

The transmission power consumption together with a transmission time duration, which includes sending ttx and receiving trx is determined 203 from actual transmissions by the transmission means.

The method may be performed during a set up i.e. commissioning phase, allowing an operator to assess the outcome of the calculations. And it may be performed during operation, allowing a system, as for example shown in FIG. 1, to self-adjust it settings to further optimize battery life time.

Figure 3:
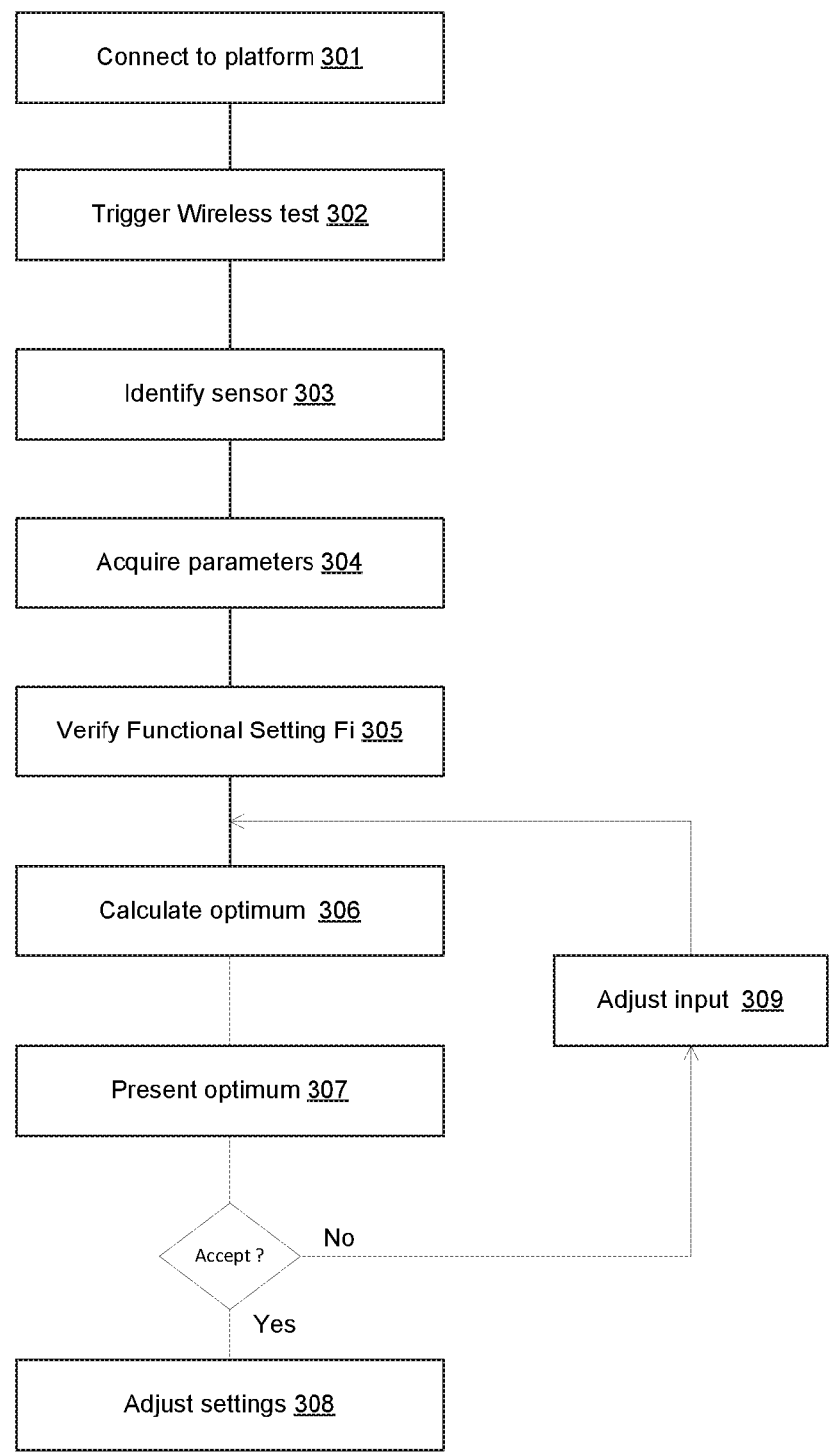
FIG. 3 is a flow chart of an example of a method during set up in accordance with the invention.

In the commissioning phase, the calculations for optimization may be initialized by an operator. Shown in FIG. 3 is a flow chart of an example of the method as applicable during a set up phase of a system as for example shown in FIG. 1. This may the first or initial set up or may be a re-set up, as for example during a maintenance check. When the operator activates a dedicated App executed on the mobile device 180, the method further includes a start by connecting 301 to the platform 120 and triggering 302 a Wireless test. The Wireless test includes transmitting a test signal over the LP-WAN connection to retrieve Tx and Rx which are parameters indicative of the type of modulation SFn. With these modulation parameters retrieved, the method continues by identifying 303 the industrial sensor and followed by acquiring 304 the parameters of sensor power consumption, sensor reading interval Ts, transmission power, transmission time interval Tw, and verifying 305 the function setting Fi, as described in relation to FIG. 2.

With all required inputs obtained, the method continues by calculating 306 an optimum for battery life time BLT, Ts and Tw, which result is presented 307 to the operator, e.g. on a display of the mobile device 180. The operator may either accept the suggested settings or reject. In the case of acceptance, the method continues by adjusting 308 the settings in accordance with the result of the calculation. In the case of rejection, the operator may enter 309 one or more different desired values for expected battery life time BLT, sensor reading interval Ts and/or periodic transmission interval Tw and optimum calculation 306 is redone based on the adjusted inputs. This may be repeated until the operator accepts a certain optimum result.

Figure 4:
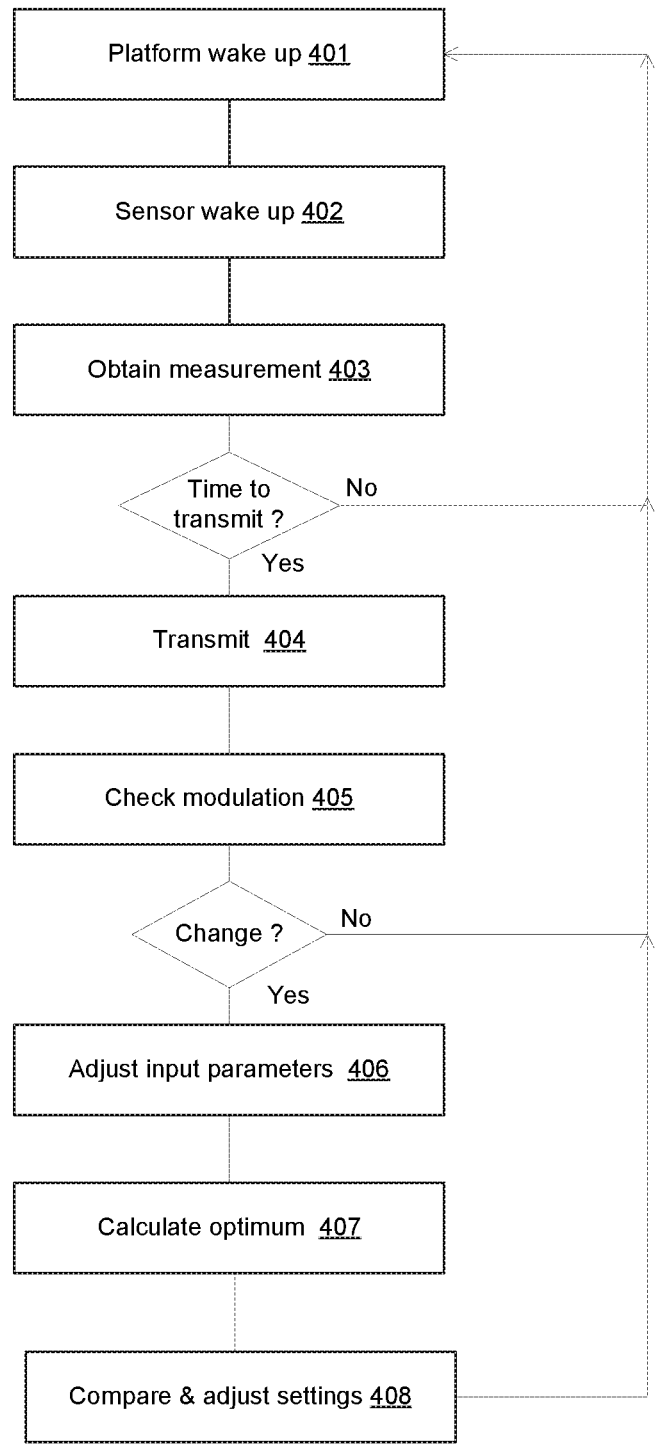
FIG. 4 is a flow chart of an example of a method during operation in accordance with the invention.

In the operational phase, the calculations for optimization may be initialized by the platform. Shown in FIG. 4 is a flow chart of an example of the method as applicable during operation of a system as for example shown in FIG. 1. At specific time intervals, the controller will wake up the platform 401. The controller then triggers the power supply to wake up the sensor 402 by supplying power for a time period equal to the sensor measurement duration ts. The sensor will perform a measurement and report the measurement which is obtained 403 by and stored by the controller. Depending on whether it is time to transmit the sensor measurements or values to e.g. an end user, the platform either goes to sleep and wakes up again 401 if it is not yet time to transmit. Or the platform transmits 404 the measurements/values.

During transmission, the signal characteristics of the LP-WAN signal may be obtained, such as the modulation SFn of a LoRa signal. These are checked against the stored input parameters, to assess whether these need to be adapted. And if required, the input parameters are adjusted 406. Following adjustment of the input parameters another Battery Life time is calculated 407 sensor reading interval Ts, and periodic transmission interval Tw. The newly calculated battery life time and corresponding settings may be compared with the current battery life time and settings to assess whether adjustment is worthwhile. And the settings are adjusted 408 accordingly, if deemed required or always by default.

In case of changes, in particular relating to the battery life time, these are send to the device of the operator or end user. In another example, the newly calculated battery life time may be reported to the end user in a next transmission 404, leaving the decision to adjust the settings to the end user.

The method as disclosed takes advantage of a further simplification for calculations by taking in account conditions dependent on the functional application of the sensor platform. A first simplification distinguishes whether Ts exists or not. A further simplification distinguishes between Ts=Tw or Ts≤Tw. This allows performing the calculations dedicated to the specific functional application of sensor. These conditions may be represented by capturing the combined system of industrial sensor and platform in a parameter referred to as Functional setting Fi, with i=0-9.

FIG. 5 provides a table of possible sensor applications and functional settings F0-F9. As can be seen, for F3 and F6 Ts does not exist, whereas for the other Fi Ts does exist. Furthermore, it indicates that for F1 and F2 Ts=Tw.

The sensor application examples of FIG. 5 distinguish different function types for reporting, counting and alarming. Within each function type different sensor output may apply, such as a basic digital value being zero "0" or one "1", an analog value in milli-Ampère or Volt, or a frequency value. For each function parameter F0-F9 an application example is provided, such pH monitoring, fluid level monitoring, or occurrence or incident measurement as e.g. a number of trucks unloading. Further shown is a sampling rate of the sensor out, if applicable, and a message or periodic transmission interval indicating the time between messages. And the relation between the sensor reading interval Ts and the periodic transmission interval Tw is indicated.

The battery life time may be calculated by taking in account the power consumption of the industrial sensor during measurement, the depletion of the battery due to self-discharge, the power consumed for sending a message and for receiving a message, and the power consumed by the controller for controlling the processes of transmissions and of switching the sensor on/off. If power converters are present for converting DC/DC voltage of the battery for the sensor and the controller, the operation of these converters is also controlled by the controller and the power consumed in relation thereto may also be taken in account when calculating the battery life time.

In general, Battery Life Time is calculated by dividing the battery capacity by the total power consumption. The battery capacity may be expressed in mAh. The total power consumption $C_{total}$ may be expressed in µA per day. The calculated battery life time BLT may be expressed in days, weeks months and even years. The Battery Life Time is then expressed in years.

$$BLT = \frac{1000 * \text{Battery Capacity}}{365 * C_{total}}$$

With the battery life time calculated, it may be determined whether the expected battery life time, i.e. the life time during which the battery is expected to operate, may be achieved. And how to adjust the sensor reading interval Ts and periodic transmission interval Tw to achieve an optimum of Battery Life time, sensor reading interval Ts and periodic transmission interval Tw.

For determining the optimum three situations are distinguished, which are different depending on the relation between Ts and Tw: Ts<Tw; Ts=Tw; or Ts does not exist.

In general, for all situations, determining an optimum starts by checking if the battery life time BLT exceeds the expected battery life time EBLT. If not, so BLT<EBLT, Tw and Ts are stepwise adjusted until the BLT is no longer smaller than the EBLT. If yes, so BLT≥EBLT, Ts and Tw are stepwise adjusted until the BLT would no longer exceed the EBLT. The latter is preferably performed while checking whether the sensor reading interval Ts does not fall below a minimum interval period of, in this example, 1 minute. In other examples, other minimum interval values may be set.

In the examples described below, the steps in which Ts and Tw are adjusted consider a factor of two for increasing or decreasing the values of Tw and Ts. In other examples, different factor values may be used or multiple different factors for consecutive steps may be used.

Figure 6:
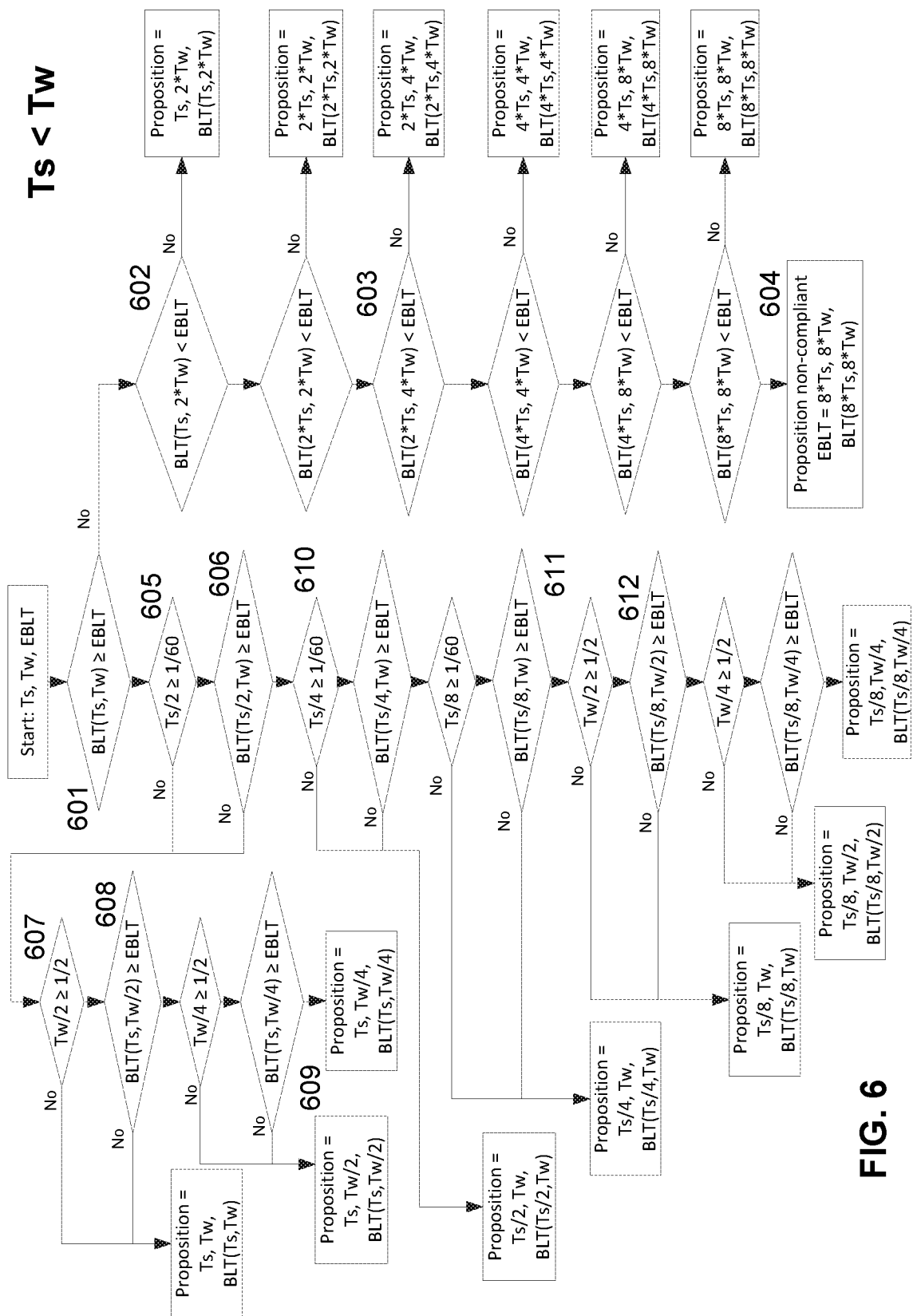
FIG. 6 is a flow chart for calculating battery life time in dependence of a functional setting.

Referring to FIG. 6, for the situation wherein Ts<Tw, determining an optimum starts by checking 601 if the battery life time BLT exceeds the expected battery life time EBLT. If not, so BLT<EBLT, Tw is adjusted by increasing it with a factor two: 2*Tw and BLT is re-calculated for Ts and 2*Tw.

If the resulting BLT 602 is no longer smaller than EBLT, these settings are stored and/or proposed to the operator. But if the resulting BLT is still smaller than EBLT, Ts is also increased by a factor two: 2*Ts and BLT is re-calculated with 2*Ts and 2*Tw.

If the resulting BLT 603 is no longer smaller than EBLT, these settings are stored and/or proposed to the operator. But if the resulting BLT is still smaller than EBLT, Tw is again increased by a factor two: 4*Tw and BLT is re-calculated with 2*Ts and 4*Tw.

This is repeated until settings for Tw and Ts are obtained that provide a BLT that is no longer smaller than the EBLT or it finally is determined that the Expected battery life time EBLT may not be possible 604.

Now, if it was determined 601 that BLT≥EBLT, Ts is decreased by a factor two: Ts/2 and it is checked whether the resulting Ts/2 does not fall below 605 the minimum sensor reading interval: Ts/2≥1/60. If not, BLT is recalculated 606 with Ts/2 and Tw. If the resulting BLT no longer exceeds EBLT, Ts is reset to Ts and now Tw is decreased 607 by a factor two: Tw/2 and the resulting decrease of Tw is checked 607 to exceed a minimum interval of half an hour. Decreasing and checking of Tw is repeated 608 until settings for Ts and Tw are determined for which BLT exceeds 609 EBLT.

If the BLT resulting for Ts/2 and Tw still does exceed EBLT, Ts is decreased 610 further by a factor two: Ts/4 and checked to comply with the minimum sensor reading interval: Ts/4≥1/60. If compliant, the BLT is recalculated for Ts/4 and Tw. If the resulting BLT no longer exceeds EBLT, the settings proposed are Ts/2 and Tw. If not, Ts is decreased 611 once more by a factor two: Ts/8. If this complies with the minimum interval 1/60 and the resulting BLT for Ts/8 and Tw still exceeds EBLT, then the method continues by decreasing Tw in consecutive steps 612 by a factor two. This is repeated, while checking compliance with the minimum periodic transmission interval ½, until maximum settings for Ts and Tw are determined 613 for which BLT does not fall below the EBLT.

Figure 7:
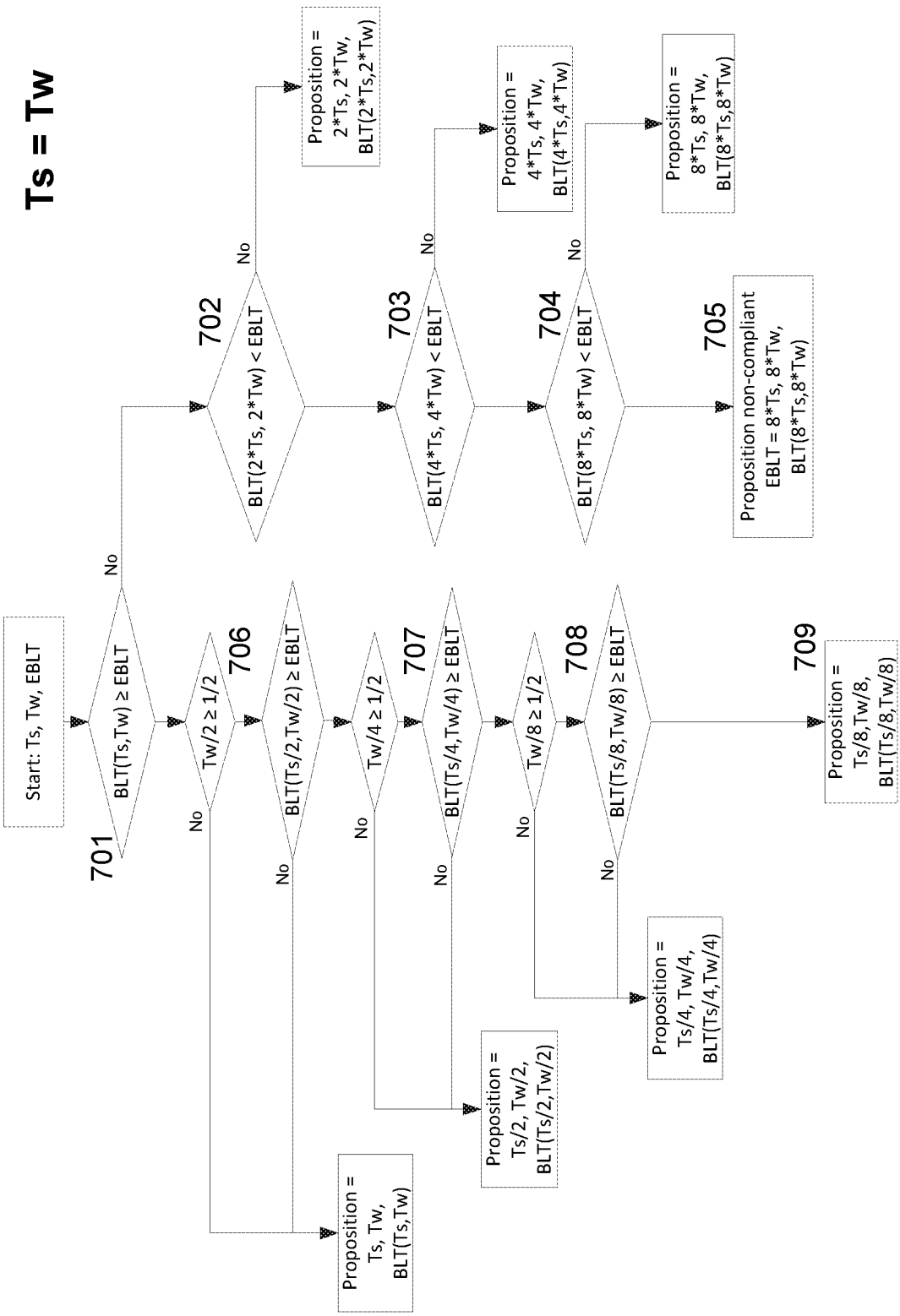
FIG. 7 is a flow chart for calculating battery life time in dependence of another functional setting.

Referring to FIG. 7, the situation of Ts=Tw, determining an optimum again starts by checking 701 if the battery life time BLT exceeds the expected battery life time EBLT. If not, so BLT<EBLT, both Ts and Tw are adjusted by increasing 702 with a factor two: 2*Ts and 2*Tw and BLT is re-calculated for 2*Ts and 2*Tw.

If the resulting BLT 702 exceeds the EBLT, the setting of 2*Ts and 2*Tw are stored and/or proposed to the operator. If the resulting BLT still falls below the EBLT, Ts and Tw are again increased 703 by a factor two: 4*Ts and 4*Tw.

If the resulting BLT exceeds the EBLT, the setting of 4*Ts and 4*Tw are stored and/or proposed to the operator. If the resulting BLT still falls below the EBLT, Ts and Tw are again increased 704 by a factor two: 8*Ts and 8*Tw.

If the resulting BLT exceeds the EBLT, the setting of 8*Ts and 8*Tw are stored and/or proposed to the operator. If the resulting BLT still falls below the EBLT, Ts and Tw are set as: 8*Ts and 8*Tw and the system reports 705 that BLT is not compliant with EBLT.

If the initial checking 701 of the battery life time showed that BLT does exceed the expected battery life time EBLT, both the periodic transmission interval Tw and sensor reading interval Ts are both decreased 706 by a factor two: Tw/2 and Ts/2. Then it is checked whether Tw/2 complies with the minimum periodic transmission interval ½. If the resulting BLT for Tw/2 and Ts/2 falls below the EBLT, settings for Tw and Ts remain Tw and Ts. If the resulting BLT for Tw/2 and Ts/2 still exceeds the EBLT, Tw and Ts are again both decreased 707 by a factor two: Tw/4 and Ts/4.

Then it is checked whether Tw/4 complies with the minimum periodic transmission interval ½. If the resulting BLT for Tw/4 and Ts/4 falls below the EBLT, settings for Tw and Ts remain Tw/2 and Ts/2. If the resulting BLT for Tw/4 and Ts/4 still exceeds the EBLT, Tw and Ts are again both decreased 708 by a factor two: Tw/8 and Ts/8.

Then it is checked whether Tw/8 complies with the minimum periodic transmission interval ½. If the resulting BLT for Tw/8 and Ts/8 falls below the EBLT, settings for Tw and Ts remain Tw/4 and Ts/4. If the resulting BLT for Tw/8 and Ts/8 still exceeds the EBLT, Tw and Ts are set at Tw/8 and Ts/8 and stored and/or proposed 709 to the operator.

Figure 8:
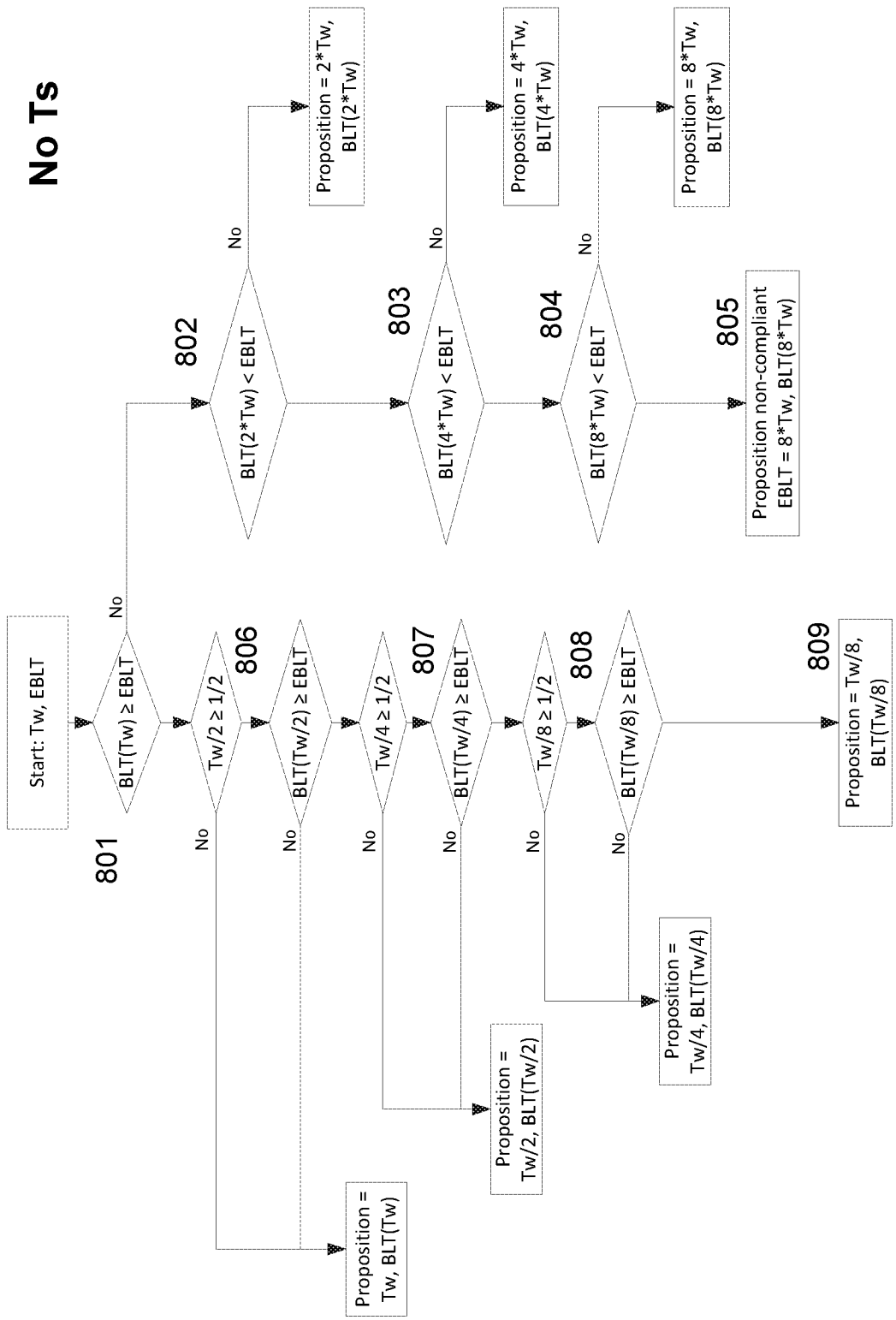
FIG. 8 is a flow chart for calculating battery life time in dependence of yet another functional setting.

Referring to FIG. 8, the situation wherein there is Ts, determining an optimum again starts by checking 801 if the battery life time BLT exceeds the expected battery life time EBLT. If not, so BLT<EBLT, Tw is adjusted by increasing 802 with a factor two: 2*Tw and BLT is re-calculated for 2*Tw.

If the resulting BLT 802 exceeds the EBLT, the setting of 2*Tw is stored and/or proposed to the operator. If the resulting BLT still falls below the EBLT, Tw is again increased 803 by a factor two: 4*Tw.

If the resulting BLT for 4*Tw exceeds the EBLT, the setting of 4*Tw is stored and/or proposed to the operator. If the resulting BLT still falls below the EBLT, Tw is again increased 804 by a factor two: 8*Tw.

If the resulting BLT for 8*Tw exceeds the EBLT, the previous setting of 8*Tw is stored and/or proposed to the operator. If the resulting BLT still falls below the EBLT, Tw is set as and 8*Tw and the system reports 805 that BLT is not compliant with EBLT.

If the initial checking 801 of the battery life time showed that BLT does exceed the expected battery life time EBLT, the periodic transmission interval Tw is decreased 806 by a factor two: Tw/2. Then it is checked whether Tw/2 complies with the minimum periodic transmission interval ½. If the resulting BLT for Tw/2 falls below the EBLT, the setting for Tw remains Tw. If the resulting BLT for Tw/2 still exceeds the EBLT, Tw is again decreased 807 by a factor two: Tw/4.

Then it is checked whether Tw/4 complies with the minimum periodic transmission interval ½. If the resulting BLT for Tw/4 falls below the EBLT, the setting for Tw remains Tw/2. If the resulting BLT for Tw/4 still exceeds the EBLT, Tw is again decreased 808 by a factor two: Tw/8.

Then it is checked whether Tw/8 complies with the minimum periodic transmission interval ½. If the resulting BLT for Tw/8 falls below the EBLT, the setting for Tw remains Tw/4. If the resulting BLT for Tw/8 still exceeds the EBLT, Tw is set at Tw/8 and stored and/or proposed 809 to the operator.

The above examples of determining an optimum for battery life time BLT, periodic transmission interval Tw and sensor reading interval Ts show that the battery life time depends on the current consumed during measurements and during transmissions. The current consumption for each may be calculated in detail based on properties of the sensor, the current consumed by the transmission means, and the current consumed by the microcontroller and/or further control logic. In some embodiments, power or DC/DC converters may be present for converting the DC voltage of the battery to a level required by the control logic and other components. Such converters in turn consume current, which may also be taken in account when calculating the total current consumed.

Although the present invention has been described above with reference to specific embodiments, it is not intended to be limited to the specific form set forth herein. Rather, the invention is limited only by the accompanying claims and, other embodiments than the specific above are equally possible within the scope of these appended claims.

Furthermore, although exemplary embodiments have been described above in some exemplary combination of components and/or functions, it should be appreciated that, alternative embodiments may be provided by different combinations of members and/or functions without departing from the scope of the present disclosure. In addition, it is specifically contemplated that a particular feature described, either individually or as part of an embodiment, can be combined with other individually described features, or parts of other embodiments.

The invention claimed is:

1. A computer implemented method for optimizing power supply life time of an industrial sensor platform comprising a processing unit, a power supply, and a transmitter, the method comprising:
identifying an industrial sensor connected to the platform for measuring sensor measurement values;
verifying a functional setting of the platform;
determining sensor power consumption and sensor measurement time ts of the identified industrial sensor;
determining transmission power consumption of the transmitter;
acquiring input parameter settings comprising an expected battery life time, a sensor reading interval Ts and periodic transmission interval Tw;
calculating an optimum for power supply life time, sensor reading interval Ts, and periodic transmission interval Tw, based on the sensor power consumption, the transmission power consumption, voltage of the power supply, and the functional setting of the platform;
adjusting settings for sensor reading interval Ts and periodic transmission interval Tw according to the optimum calculated.

2. A method according to claim 1, wherein the functional setting is one of a set of at least three functional settings; each setting comprising:
an indication of whether the sensor reading interval Ts is defined or not, and if defined whether the sensor reading interval Ts is smaller and/or equal to Tw;
a default setting for the sensor reading interval Ts if defined; and
a default setting for the periodic transmission interval Tw.

3. A method according to claim 1, further comprising:
triggering a wireless test for determining a modulation type of the transmitter.

4. A method according to claim 1, further comprising:
presenting the calculated optimum to a mobile device or to a remote computer.

5. A method according to claim 1, further comprising:
acquiring confirmation of the settings for sensor reading interval Ts and periodic transmission interval Tw.

6. A method according to claim 1, wherein calculating the optimum comprises:
verifying whether calculated battery life time complies with the expected battery life time; and
if not complied with, adjusting settings by increasing the periodic transmission interval Tw and/or the sensor reading interval Ts until the expected battery life time is complied with; or
if complied with, adjusting settings by decreasing the periodic transmission interval Tw and/or the sensor reading interval Ts until a minimum setting is calculated for which expected battery life time is still complied with.

7. A method according to claim 1, wherein the transmission power consumption of the transmitter comprises:
power consumption during a transmission time duration for sending ttx; and
power consumption during a transmission time duration for receiving trx.

8. Industrial sensor platform, comprising:
a processing unit;
a power supply, wherein the power supply is configured to switch power to a sensor on/off for a period set by the processing unit as sensor measurement time ts and with a sensor reading interval Ts; and
a transmitter, wherein the transmitter is configured to transmit sensor measurement values for a period set by the processing unit as a periodic transmission interval Tw.

9. Industrial sensor platform according to claim 8, wherein the processing unit is configured to:
calculate an optimum for a power supply life time, sensor reading interval Ts, and periodic transmission interval Tw; and
adjust system settings according to the optimum calculated; and
wherein the optimum calculation comprises the parameters:
power supply voltage;
sensor power consumption;
transmission power consumption; and
a functional setting of the platform.

10. Industrial sensor system, comprising:
the industrial sensor platform according to claim 8; and
at least one sensor for measuring a sensor value.

11. A computer implemented method for optimizing power supply life time of an industrial sensor platform comprising a processing unit, a power supply, and a transmitter, the industrial sensor platform being operatively connected to a sensor, the method comprising:
obtaining measurement values from the sensor;
transmitting the measurement values in accordance with a periodic transmission interval Tw;
checking transmission power consumption of the transmitter;
upon determining that transmission power consumption of the transmitter has changed:
adjusting input parameter settings comprising an expected battery life time, a sensor reading interval Ts and periodic transmission interval Tw;
calculating an optimum for power supply life time, sensor reading interval Ts, and periodic transmission interval Tw, based on power consumption of the sensor, the transmission power consumption, voltage of the power supply, and a functional setting of the system;
adjusting settings for sensor reading interval Ts and periodic transmission interval Tw according to the optimum calculated.

* * * * *